United States Patent [19]
Jung et al.

[11] Patent Number: 6,074,944
[45] Date of Patent: Jun. 13, 2000

[54] METHODS FOR PRIMING WAFERS EMPLOYED IN INTEGRATED CIRCUIT DEVICES USING DIHYDROPYRANE

[75] Inventors: Jin-hang Jung; Hoe-sik Chung, both of Kyungki-do, Rep. of Korea

[73] Assignee: Samsung Electronics Co., Ltd., Rep. of Korea

[21] Appl. No.: 09/002,636

[22] Filed: Jan. 5, 1998

[30] Foreign Application Priority Data

Jan. 6, 1997 [KR] Rep. of Korea ............................ 97-130

[51] Int. Cl.$^7$ ..................................... H01L 21/44
[52] U.S. Cl. ........................ 438/677; 438/680; 438/681; 438/780; 438/789; 438/790
[58] Field of Search ..................... 430/311, 326; 438/758, 677, 680, 681, 780, 789, 790

[56] References Cited

U.S. PATENT DOCUMENTS 5,565,304 10/1996 Honda ...................................... 430/311
6,033,826 3/2000 Urano et al. ............................ 430/270

*Primary Examiner*—David Nelms
*Assistant Examiner*—Reneé R. Berry
*Attorney, Agent, or Firm*—Myers Bigel Sibley & Sajovec, P.A.

[57] ABSTRACT

Methods of treating surfaces of wafers to be used in forming integrated circuit devices comprise applying dihydropyrane to the surfaces of the wafers wherein hydrophobicity is imparted to the surfaces. The applying steps are carried out prior to applying photoresists to the wafers.

12 Claims, 1 Drawing Sheet

METHODS FOR PRIMING WAFERS EMPLOYED IN INTEGRATED CIRCUIT DEVICES USING DIHYDROPYRANE

FIELD OF THE INVENTION

The invention relates to methods for priming wafers employed in integrated circuit devices.

BACKGROUND OF THE INVENTION

During the manufacture of integrated circuit devices (e.g., semiconductor devices), wafers are typically utilized which have photoresists formed thereon. During subsequent photolithography processes, the photoresists are usually exposed to light, and patterns are then typically formed. The top surfaces of the wafers may thereafter be selectively etched in accordance with the characteristics of the patterns. Ions may subsequently be implanted into the surfaces to form active regions in the wafers. As a result, circuits having predetermined electrical characteristics may be formed.

The ability of a photoresist to adhere to a wafer is typically important since it may directly impact the yield of an integrated circuit device containing the wafer. If a photoresist poorly adheres to the wafer surface, undercutting may occur in a subsequent etching process. Typically, this etching process is carried out isotropically, i.e., the etching is usually performed on upper and lower surfaces of a layer present in a device. A widened pattern may be formed as a result of the isotopic etching process. This pattern may become further widened in the event the photoresist detaches from the wafer surface. Such a detachment is often caused by poor adhesion between the photoresist and the wafer. The problem may be difficult to correct since a photoresist is typically hydrophobic and the surface of a wafer is typically hydrophilic.

A number of proposals have been set forth in attempting to address the above difficulties. One proposal focuses primarily on blasting filtered nitrogens which are often present on the surface of the wafer. Another proposal involves mechanically scrubbing a wafer surface.

Yet another proposal relates to cleaning the surface of a wafer by applying pressurized water thereto. For example, the water may be applied at pressures ranging from about 2000 psi to about 4000 psi. Thereafter, the wafer may be heat dried such that it's surface is potentially hydrophobic. Heat drying, however, may not be an effective technique for imparting hydrophobicity to a wafer surface. As a result, a photoresist may not adequately adhere to the surface. The above problem is potentially worsened with respect to semiconductor devices, since these devices are becoming more highly integrated with wafers contained therein having larger holes.

Accordingly, attempts to enhance adhesion have primarily centered on chemically treating a wafer surface. One proposal relates to painting the surface of a wafer with a xylene solution. Utilizing xylene, however, often results in poor drying efficiency. Another proposed technique relates to contacting the wafer with a dichlorosilane solution. Potential difficulties, however, may arise in connection with this solution. Specifically, the wafer may not display adequate adhesive strength. Additionally, since the dichlorosilane is hydrophilic, it is difficult to maintain it in a non-diluted state. Moreover, a sizeable number of small holes may be formed in a photoresist layer coated with dichlorosilane, which can hinder formation of a correct pattern therein.

In an attempt to confront the above problems, solutions containing hexamethyl disilazane (HMDS) have been applied to wafer surfaces. A typical HMDS solution is adhered to the wafer surface by a employing a vapor priming method. The vapor priming method is usually employed to enable the HMDS to potentially react with the wafer surface and thus form a hydrophobic organic layer on the surface. In particular, the hydrophobic organic layer is designed to be used as a medium for forming the photoresist layer. It is believed that conventional HMDS is formed on the surface of the wafer via a condensation reaction between the wafer and the HMDS as illustrated in the reaction formula (1) and FIG. 1.

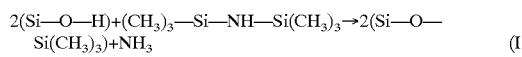

As shown, ammonia gas is generated by the reaction. The presence of the ammonia may be potentially disadvantageous due to potential environmental risks. In particular, this problem may be exacerbated when a deep ultraviolet (DUV) wave source is employed during processing. A DUV usually has a wavelength which ranges between about 180 nm and 330 nm.

Notwithstanding these prior art attempts, it would be advantageous to provide a hydrophobic organic layer on a wafer surface which may provide adequate adhesion between the wafer surface and a photoresist layer thereon. Furthermore, it would be advantageous to provide such an organic layer with minimal environmental risks potentially associated therewith.

SUMMARY OF THE INVENTION

In one aspect, the invention provides methods of treating surfaces of wafers to be employed in integrated circuit devices. The methods comprise applying dihydropyrane to the surfaces of the wafers such that hydrophobicity is imparted to the surfaces. The applications are carried out prior to applying photoresists to the wafers.

In a second aspect, the invention relates to other methods of treating surfaces of wafers to be employed in integrated circuit devices. The methods comprise applying dihydropyrane under vacuum conditions such that hydrophobicity is imparted to the surfaces of the wafers. The applying steps are carried out prior to applying photoresists to the wafers.

In a third aspect, the invention also provides wafers to be employed in integrated circuit devices. The wafers contain primer layers on the surfaces thereof. The primer layers comprise dihydropyrane.

DETAILED DESCRIPTION OF THE PREFERRED EMBODIMENTS

Figure 1:
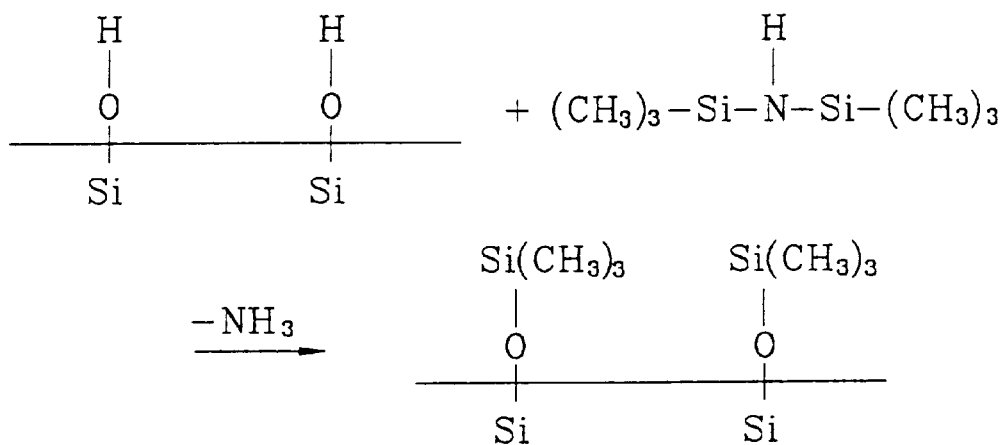
FIG. 1 is a schematic illustration of a reaction between hexamethyl disilazane and a silicon wafer material.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In one aspect, the invention provides methods of treating surfaces of wafers to be employed in integrated circuit devices such as, for example, semiconductor devices. The methods comprise applying solutions comprising dihydropyrane to the surfaces of the wafers such that hydrophobicity is imparted to the surfaces. The wafers preferably comprise silicon. The applications are carried out prior to applying photoresists to the wafers. Photoresists may be subsequently applied to the wafers such that the photoresists contact the treated wafer surfaces.

In a second aspect, the invention relates to other methods of treating surfaces of wafers to be employed in integrated circuit devices. The methods comprise applying solutions comprising dihydropyrane under vacuum conditions such that hydrophobicity is imparted to the surfaces of the wafers. The applying steps are carried out prior to applying the photoresists to the wafers. Photoresists may be applied to the wafers such that the photoresists contact the wafer surfaces.

In a third aspect, the invention also provides wafers to be used in forming integrated circuit devices. The wafers contain primer layers on the surfaces of the wafers. The primer layers comprise dihydropyrane.

As known, under standard temperature and pressure conditions dihydropyrane exists as a substantially colorless fluid having aromatic characteristics similar to ethers. The boiling and ignition points of dihydropyrane have been measured to be approximately 84.2° C. and −17.7° C. respectively. Since dihydropyrane may present potential toxicity and flammability risks, it preferable that the methods be carried out in the presence of non-flammable gases which exclude appreciable amounts of oxygen. Examples of nonflammable gases include, but are not limited to, helium, hydrogen, and mixtures thereof.

The methods of the invention may be carried out using known and appropriate techniques. The dihydropyrane may be applied, for example, as a gas or as a liquid. When employing non-flammable gaseous atmospheres, the gases may be provided in compressed states from gas bombs. The solutions are then preferably bubbled under the non-flammable gases, preferably nitrogen, and then applied to the wafers.

Prior to application of the solutions to the wafers, the solutions are preferably heated to temperatures between about 30° C. to about 200° C. The wafers also may be heated to temperatures between about 30° C. and 200° C. prior to the applications of the solutions. The preheating of the solutions and/or the wafers allow the applying steps to preferably be carried out from about 30° C. to about 200° C.

Figure 2:
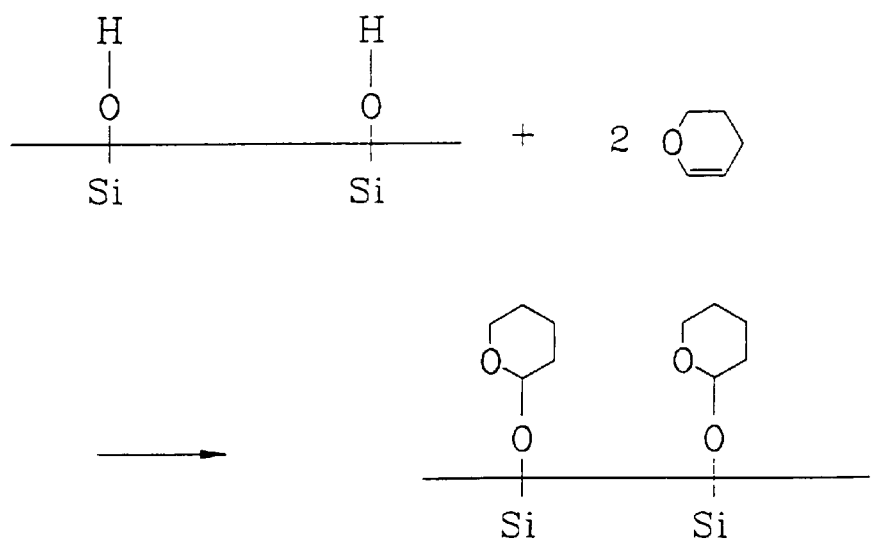
FIG. 2 is a schematic illustration of a reaction between dihydropyrane and a silicon wafer material according to the invention.

The invention may be advantageous in several respects. Since the solutions of dihydropyrane are capable of imparting a high level of hydrophobicity to the surfaces of the wafers, the wafer surfaces may provide greater adhesion to photoresists, especially in comparison to non-primed wafers. The use of dihydropyrane as a primer results in minimal gas generation during reaction with the wafer surface. The reaction of dihydropyrane with silicon is illustrated in reaction scheme (II) and FIG. 2.

$$Si-O-H + C_5H_8O \rightarrow Si-O-(C_5H_9O) \quad (II)$$

In contrast, using hexamethyl disilazane often generates ammonia which may be potentially undesirable from an environmental standpoint, resulting in the need for air discharge in an attempt to remove the ammonia. In addition, the invention allows for a possible reduction in the risk of wafer recontamination since only small levels of residual by-products may be formed during the methods of the invention. Accordingly, potential increased yields of integrated circuit devices may be realized.

The following example is provided to illustrate the present invention, and should not be construed as limiting thereof.

EXAMPLE 1

A barrel containing dihydropyrane was flushed with pure nitrogen gas and then preheated to a temperature of 70° C. A second supply of nitrogen gas heated to 70° C. is added to the barrel in order to bubble the dihydropyrane. The dihydropyrane is subsequently applied to the wafer at 70° C.

In the drawings, specification, and example, there have been disclosed typical preferred embodiments of the invention and, although specific terms are employed, they are used in a generic and descriptive sense only and not for the purposes of limitation, the scope of the invention being set forth in the following claims.

What is claimed is:

1. A method of treating a surface of a wafer to be used in forming an integrated circuit device, said method comprising:

applying dihydropyrane to the surface of the wafer comprising silicon having hydroxyl groups attached thereto, wherein the dihydropyrane reacts with the hydroxyl groups such that hydrophobicity is imparted to the wafer surface, said applying step being carried out prior to applying a photoresist to the wafer.

2. A method according to claim 1, wherein the dihydropyrane is in the form of a liquid.

3. A method according to claim 1, wherein the dihydropyrane is in the form of a gas.

4. A method according to claim 1, wherein said applying step is carried out at a temperature ranging from about 30° C. to about 200° C.

5. A method according to claim 1, wherein said applying step is carried out in the presence of a non-flammable gas.

6. A method according to claim 5, wherein the non-flammable gas is selected from the group consisting of hydrogen, helium, and mixtures thereof.

7. A method according to claim 1, further comprising the step of applying a photoresist to the wafer such that the photoresist contacts the treated wafer surface.

8. A method of treating a surface of a wafer to be used in forming an integrated circuit device, said method comprising:

applying dihydropyrane to the surface of the wafer comprising silicon having hydroxyl groups attached thereto, wherein the dihydropyrane reacts with the hydroxyl groups such that hydrophobicity is imparted to the wafer surface, said applying step being carried out prior to applying a photoresist to the wafer and under vacuum.

9. A method according to claim 8, wherein said applying step is carried out in the presence of a non-flammable gas.

10. A method according to claim 9, wherein the non-flammable gas is selected from the group consisting of helium, hydrogen, and mixtures thereof.

11. A method according to claim 8, wherein said applying step is carried out at a temperature ranging from about 30° C. to about 200° C.

12. A method according to claim 8, further comprising the step of applying a photoresist to the wafer such that the photoresist contacts the treated wafer surface.

* * * * *